United States Patent
Chang et al.

(10) Patent No.: US 12,006,589 B2
(45) Date of Patent: Jun. 11, 2024

(54) PURIFICATION APPARATUS AND METHOD OF PURIFYING HOT ZONE PARTS

(71) Applicant: GlobalWafers Co., Ltd., Hsinchu (TW)

(72) Inventors: Chung-Sheng Chang, Hsinchu (TW); Masami Nakanishi, Hsinchu (TW); Yu-Sheng Su, Hsinchu (TW); Yen-Hsun Chu, Hsinchu (TW); Yung-Chi Wu, Hsinchu (TW); Yi-Hua Fan, Hsinchu (TW)

(73) Assignee: GLOBALWAFERS CO., LTD., Hsinchu (TW)

( * ) Notice: Subject to any disclaimer, the term of this patent is extended or adjusted under 35 U.S.C. 154(b) by 240 days.

(21) Appl. No.: 17/679,576

(22) Filed: Feb. 24, 2022

(65) Prior Publication Data

US 2022/0267923 A1 Aug. 25, 2022

(30) Foreign Application Priority Data

Feb. 25, 2021 (TW) .................................. 110106707

(51) Int. Cl.
*C30B 13/14* (2006.01)
*C30B 13/16* (2006.01)

(52) U.S. Cl.
CPC .............. *C30B 13/16* (2013.01); *C30B 13/14* (2013.01)

(58) Field of Classification Search
CPC .... C30B 13/14; C30B 13/16; Y10T 117/1032
See application file for complete search history.

(56) References Cited

U.S. PATENT DOCUMENTS

| 6,246,029 B1 | 6/2001 | Addis |
| 2015/0075223 A1 | 3/2015 | Dohnomae |
| 2017/0096746 A1 | 4/2017 | Schmid et al. |

FOREIGN PATENT DOCUMENTS

| CN | 100380591 | * | 4/2008 |
| CN | 102794281 | * | 11/2012 |
| CN | 103498195 B | | 11/2016 |
| CN | 205711039 U | | 11/2016 |
| CN | 111041554 A | | 4/2020 |
| CN | 111254291 A | | 6/2020 |
| CN | 211199471 U | | 8/2020 |
| JP | 2019091848 | * | 6/2019 |
| TW | 200921791 | * | 5/2009 |

(Continued)

*Primary Examiner* — Robert M Kunemund
(74) *Attorney, Agent, or Firm* — Li & Cai Intellectual Property (USA) Office

(57) ABSTRACT

A purification apparatus and a method of purifying hot zone parts are provided. The purification apparatus is configured to remove impurities attached on at least one hot zone part. The purification apparatus includes a crystal high temperature furnace, an enclosed box disposed in the crystal high temperature furnace, an outer tube connected to the crystal high temperature furnace and the enclosed box, an inner tube disposed in the outer tube, and a gas inlet cover connected to the outer tube. The crystal high temperature furnace includes a furnace body, a furnace cover, and a thermal field module disposed in the furnace body. The gas inlet cover is configured to input a noble gas into the enclosed box through the inner tube, and the thermal field module is configured to heat the noble gas so that the impurities are heated and vaporized through the noble gas.

11 Claims, 7 Drawing Sheets

(56) References Cited

FOREIGN PATENT DOCUMENTS

| WO | WO2013108373 A1 | 7/2013 |
| WO | WO2013174229 A1 | 11/2013 |
| WO | WO 2015089606 A1 | 6/2015 |

\* cited by examiner

PURIFICATION APPARATUS AND METHOD OF PURIFYING HOT ZONE PARTS

CROSS-REFERENCE TO RELATED PATENT APPLICATION

This application claims the benefit of priority to Taiwan Patent Application No. 110106707, filed on Feb. 25, 2021. The entire content of the above-identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a purification apparatus and a purifying method, and more particularly to a purification apparatus and a method of purifying hot zone parts that is configured to be implemented with the purification apparatus.

BACKGROUND OF THE DISCLOSURE

Conventionally, a crystal growth apparatus (e.g., a Czochralski crystal growth apparatus) is often used to produce products such as crystal ingots, crystal rods, or monocrystalline. If manufacturing processes of the above-mentioned products need to be adjusted according to market demands, in order to avoid the contamination caused by impurities such as arsenic compounds and silicon compounds contained in a graphite thermal field of the crystal growth apparatus, a new thermal field and related accessories thereof often need to be provided to match the adjusted manufacturing processes.

However, providing the new thermal field and related accessories thereof usually takes at least 3 to 6 months and costs a sizable amount of money. As a result, the time and cost of manufacturing different products with the conventional crystal growth apparatus will be significantly increased.

In the related art, China Patent Publication No. 111254291 still requires a specific purification device to be provided in order to purify a specific compound (e.g., copper ingot). In another instance, China Patent Publication No. 111254291, despite addressing the problem of high purity purification of large copper ingots by virtue of "in a furnace including a cooling medium inlet tube 12 and a cooling medium outlet tube 17, copper being purified according to different coefficients and saturation vapor pressures of impurities in copper," a function of the cooling medium inlet tube 12 is nevertheless only to cool down a graphite support platform 10, and the cooling medium inlet tube 12 cannot be used to directly remove the impurities.

Accordingly, in the related art, when faced with the problem of adjustments in the manufacturing process, there has yet to be a better solution than providing a new thermal field and the related accessories thereof.

Therefore, how to overcome the above-mentioned problems by improving the structural design has become one of the important issues to be solved in the related art.

SUMMARY OF THE DISCLOSURE

In response to the above-referenced technical inadequacies, the present disclosure provides a purification apparatus and a method of purifying hot zone parts.

In one aspect, the present disclosure provides a purification apparatus, which is configured to remove impurities attached on at least one hot zone part, the purification apparatus includes a crystal high temperature furnace, an enclosed box, an outer tube, an inner tube, and a gas inlet cover. The crystal high temperature furnace includes a furnace body, a furnace cover mounted on the furnace body, and a thermal field module disposed in the furnace body. The enclosed box is disposed in the thermal field module and includes a box body and a box cover detachably mounted on the box body, and the box body is configured to accommodate the at least one hot zone part. The outer tube passes through the furnace cover and includes a first outer tube opening, a second outer tube opening, and a third outer tube opening. The first outer tube opening and the second outer tube opening are spaced apart from a side of the furnace cover, the side of the furnace cover is distant from the furnace body, and the third outer tube opening is connected to the box cover. The inner tube is disposed within the outer tube and spaced apart from an inner side of the outer tube. The inner tube includes a first inner tube opening and a second inner tube opening. The gas inlet cover is connected to the first outer tube opening and configured to input a noble gas into the enclosed box through the inner tube. The thermal field module is configured to heat the noble gas in the enclosed box so that the impurities are heated and vaporized through the noble gas.

In another aspect, the present disclosure provides a method of purifying hot zone parts, which is configured to be implemented with the purification apparatus mentioned above, the method of purifying the hot zone parts includes performing a gas input step and performing a heating step. The gas input step includes inputting the noble gas from the first inner tube opening through the inner tube into the enclosed box that has the at least one hot zone part disposed therein so that the noble gas fills the enclosed box. The heating step includes using a plurality of heaters to heat the noble gas in the enclosed box so that a temperature of the noble gas is between 1400° C. to 1500° C. and the impurities are heated and vaporized through the noble gas.

Therefore, in the purification apparatus and the method of purifying hot zone parts provided by the present disclosure, by virtue of "the gas inlet cover being configured to input a noble gas into the enclosed box through the inner tube" and "the thermal field module being configured to heat the noble gas in the enclosed box so that the impurities are heated and vaporized through the noble gas," the at least one hot zone part can be purified and reused so that the cost incurred by switching or adjusting product manufacturing processes can be reduced.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
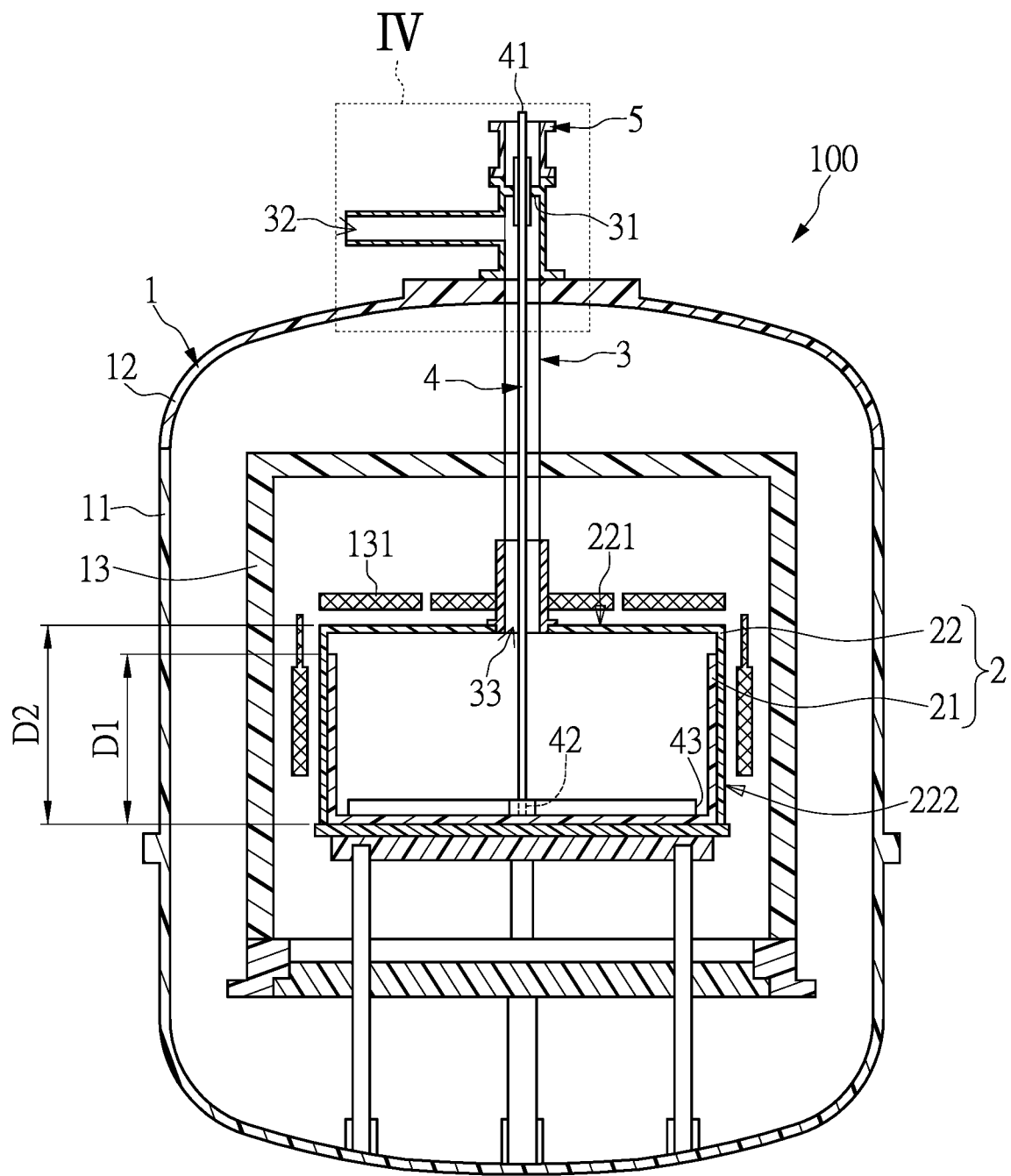
FIG. 1 is a sectional view of a purification apparatus according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1 to FIG. 6, a first embodiment of the present disclosure provides a purification apparatus 100, which is configured to remove impurities 300 attached on at least one hot zone part 200 that is disposed in the purification apparatus 100. In the present embodiment, the at least one hot zone part 200 is mainly made of graphite carbon fiber material, and the at least one hot zone part 200 is at least one crystal growth accessories that can be used in a Czochralski process.

More specifically, in practice, the least one hot zone part 200 of the present embodiment can be a thermal shield, a heater, and a thermal insulation sleeve, but the present disclosure is not limited thereto. For instance, in other embodiments, the least one hot zone part 200 can also be other crystal growth accessories such as a graphite crucible.

It should be noted that, in the present embodiment, the impurities 300 are arsenic compounds, but the present disclosure is not limited thereto. For instance, in other embodiments not shown in the present disclosure, the impurities 300 can also be silicon compounds, and the silicon compounds can be silicon or silicon dioxide.

More specifically, the purification apparatus 100 is modified from a crystal growth apparatus, and the purification apparatus 100 can also be used to provide products such as crystal ingots, crystal rods or monocrystalline, but the present disclosure is not limited thereto. For instance, in other embodiments not shown in the present disclosure, the purification apparatus 100 can also be modified from an existing floating zone crystal growth apparatus.

In continuation of the above, specifically speaking, the purification apparatus 100 can be used to purify the impurities 300 attached on the at least one hot zone part 200 that is disposed in the purification apparatus 100 after product manufacturing processes of products such as crystal ingots, crystal rods, or monocrystalline are finished, so that the at least one hot zone part 200 can be directly used in other product manufacturing processes.

Figure 5:
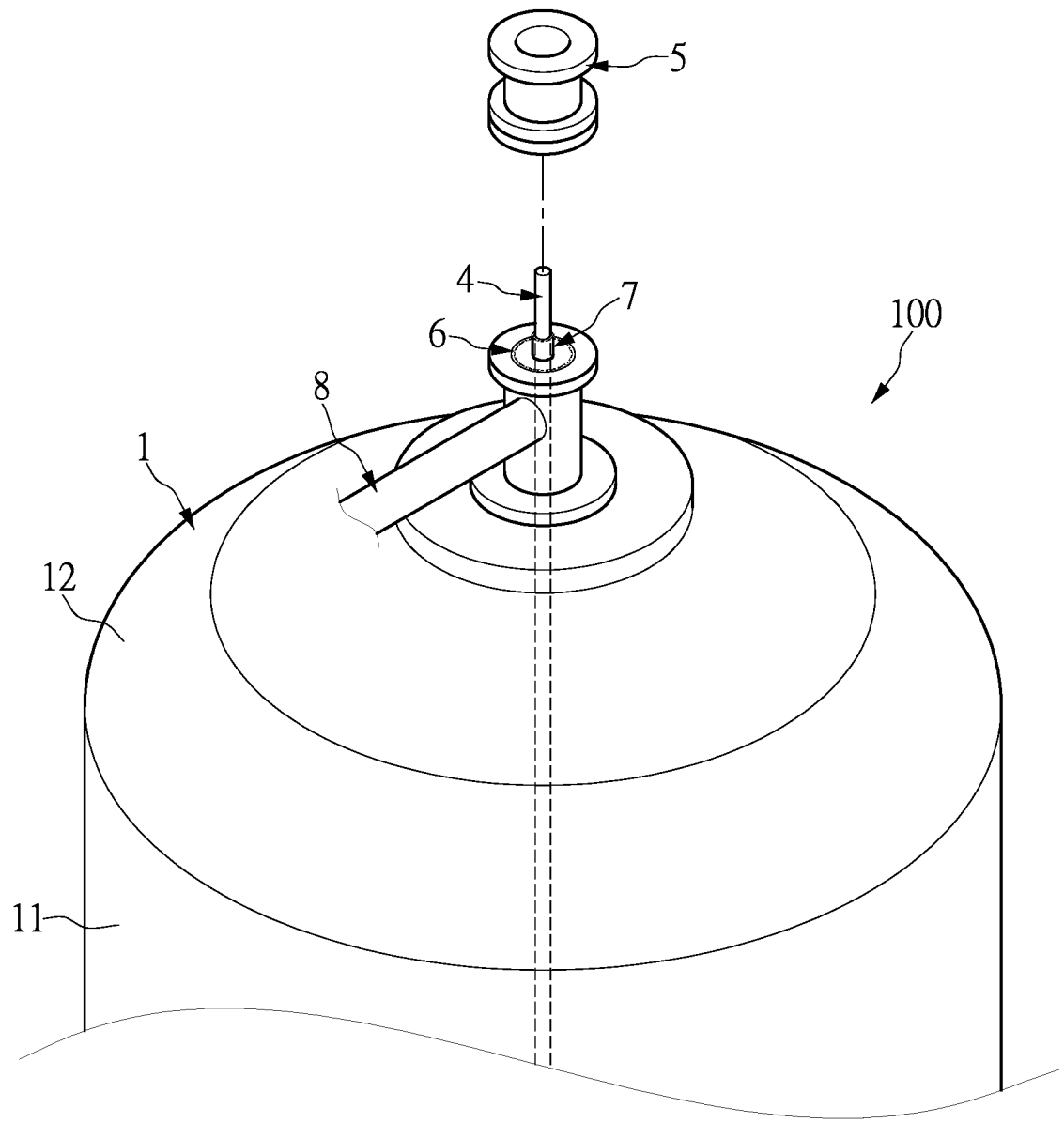
FIG. 5 is an exploded view of an inner tube and an outer tube according to the first embodiment of the present disclosure.

As shown in FIG. 1 and FIG. 5, the purification apparatus 100 includes a crystal high temperature furnace 1, an enclosed box 2 disposed in the crystal high temperature furnace 1, an outer tube 3 connected to the crystal high temperature furnace 1 and the enclosed box 2, an inner tube 4 disposed within the outer tube 3 and spaced apart from an inner side of the outer tube 3, a gas inlet cover 5 connected to the outer tube 3, a first sealing part 6 disposed between the gas inlet cover 5 and the outer tube 3, a second sealing part 7 surroundingly disposed on the inner tube 4, and a gas extraction device 8 connected to the outer tube 3, but the present disclosure is not limited thereto. For instance, in other embodiments not shown in the present disclosure, the purification apparatus 100 can also be provided without the first sealing part 6 the second sealing part 7, and the gas extraction device 8.

More specifically, the crystal high temperature furnace 1 includes a furnace body 11, a furnace cover 12 mounted on the furnace body 11, and a thermal field module 13 disposed in the furnace body 11. In addition, the thermal field module 13 includes a plurality of heaters 131 arranged adjacent to the enclosed box 2, the heaters 131 can be used to heat the enclosed box 2, and the furnace cover 12 can be used to enable the furnace body 11 to provide an opening so that the at least one hot zone part 200 can be disposed in the furnace body 11.

Figure 2:
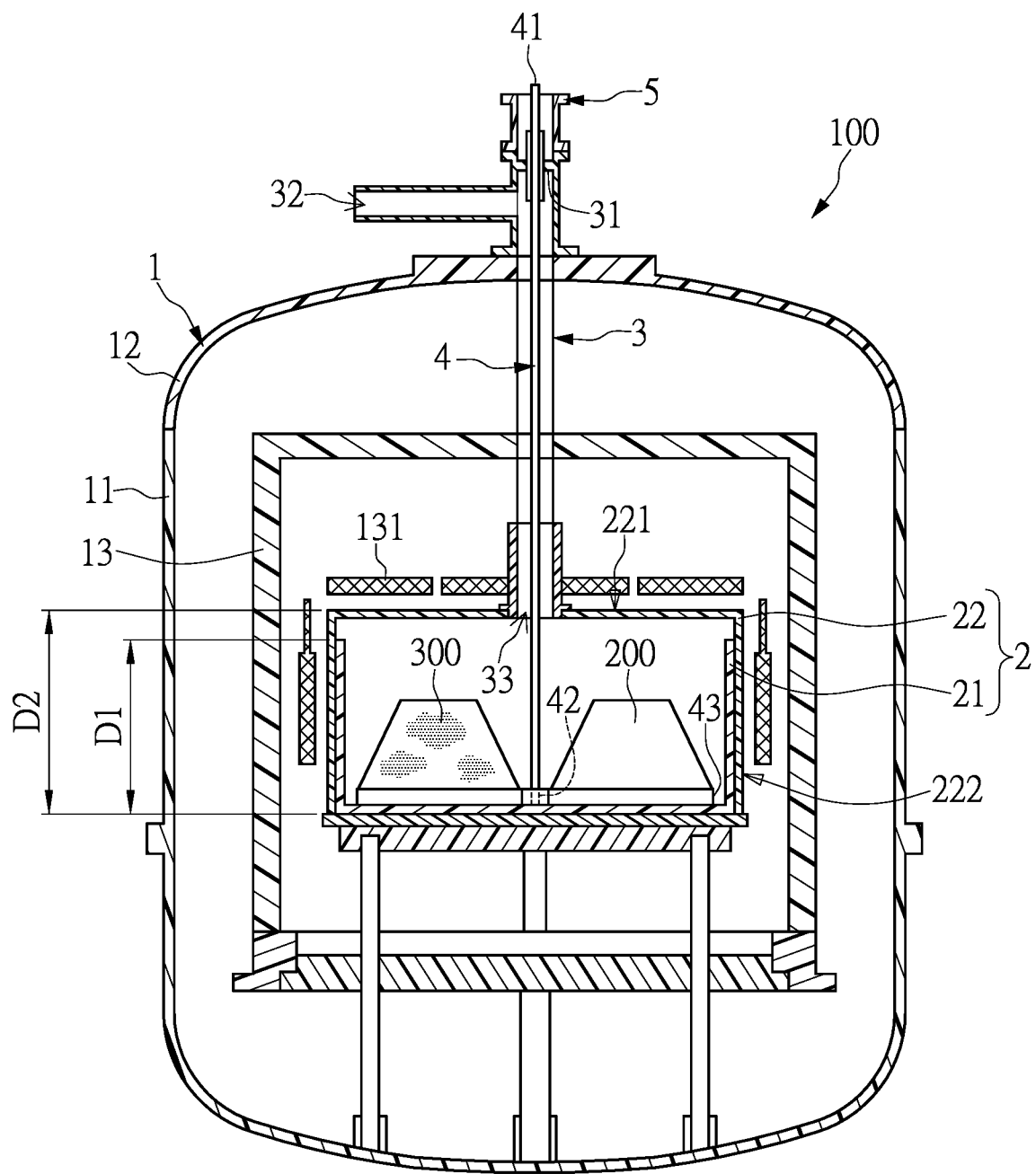
FIG. 2 is a sectional view of at least one hot zone part that are disposed in the purification apparatus according to the first embodiment of the present disclosure.
Figure 3:
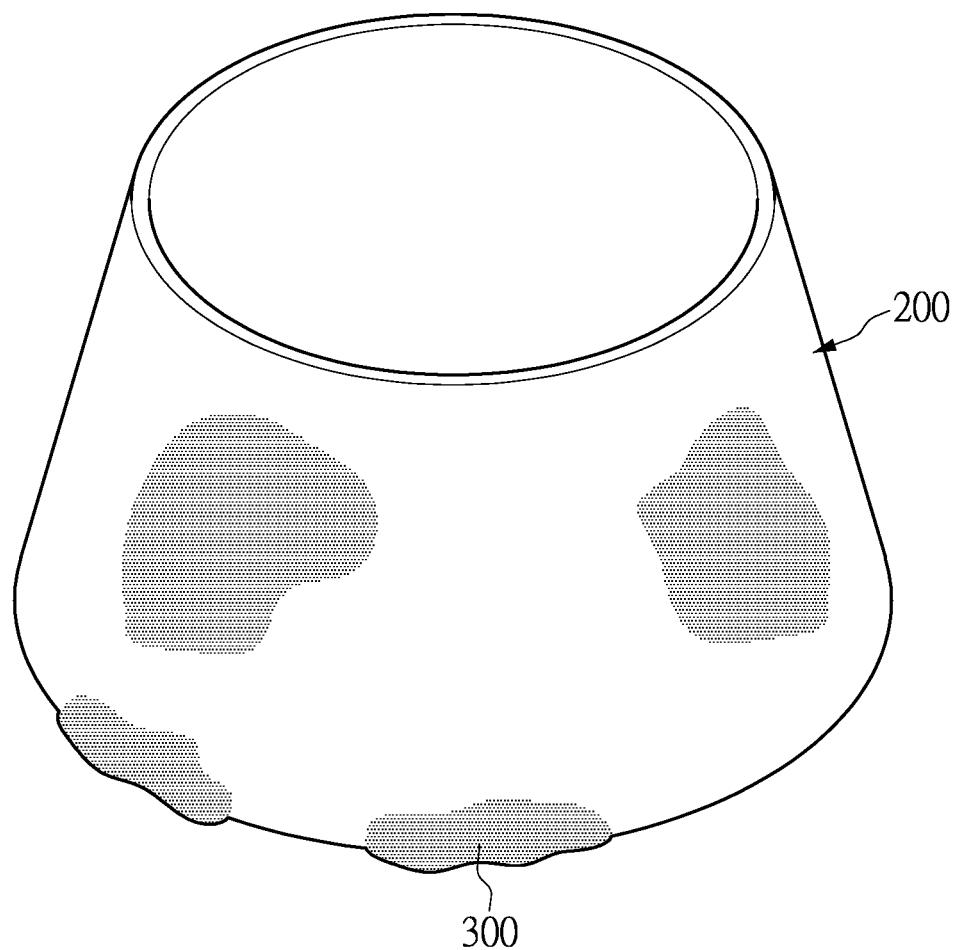
FIG. 3 is a schematic perspective view of the at least one hot zone part according to the first embodiment of the present disclosure.

As shown in FIG. 2, the enclosed box 2 is disposed in the thermal field module 13, and the enclosed box 2 includes a box body 21 and a box cover 22 detachably mounted on the box body 21. In addition, the box body 21 can be used to accommodate the at least one hot zone part 200. More specifically, the box cover 22 has a top surface 221 and a plurality of side surfaces 222 connected to the top surface 221, and a height of each of the side surfaces 222 is greater than a height of the box body 21.

Specifically speaking, in the present embodiment, when the box cover 22 is mounted on the box body 21, the side surfaces 222 of the box cover 22 are movably attached on a plurality of side surfaces of the box body 21. In addition, the height of the box body 21 is defined as a box height D1, and the height of the side surface 222 is defined as a box cover height D2.

It should be noted that, in the present embodiment, the box cover height D2 is greater than the box height D1, and the box cover height D2 and the box height D1 are at least greater than a height of any one of the hot zone parts 200 so that when the box cover 22 is mounted on the box body 21, a contact area between the side surfaces 222 of the box cover 22 and the corresponding side surfaces of the box body 21 can be effectively increased, but the present disclosure is not limited thereto. For instance, in other embodiments not shown in the present disclosure, the box height D1 can also be less than the height of any one of the hot zone parts 200.

Figure 4:
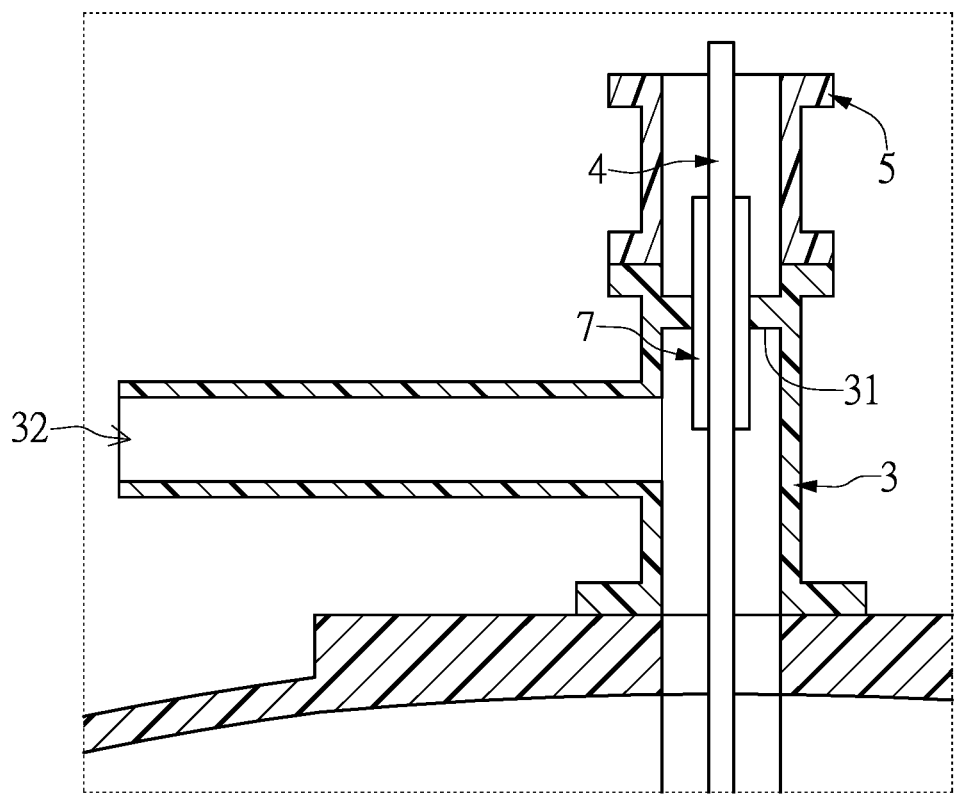
FIG. 4 is an enlarged view of part IV of FIG. 1.

As shown in FIG. 1 and FIG. 4, the outer tube 3 passes through the furnace cover 12, and the outer tube 3 includes a first outer tube opening 31, a second outer tube opening 32, and a third outer tube opening 33. In addition, the first outer tube opening 31 and the second outer tube opening 32 are spaced apart from a side of the furnace cover 12, the side of the furnace cover 12 is relatively distant from the furnace body 11, and the third outer tube opening 33 is connected to the box cover 22.

More specifically, in the present embodiment, the outer tube 3 is a flange tee, and the outer tube 3 has two tube center axes that are perpendicular to each other. In addition, the first outer tube opening 31 and the third outer tube opening 33 are co-located on any one of the tube center axes, and the second outer tube opening 32 is perpendicular to another one of the tube center axes, but the present disclosure is not limited thereto. For instance, in other embodiments not shown in the present disclosure, the outer tube 3 can also be a Y-shaped tube.

The inner tube 4 is disposed within the outer tube 3 and spaced apart from the inner side of the outer tube 3, and the inner tube 4 includes a first inner tube 41 adjacent to the first outer tube opening 31 and a second inner tube opening 42 that is relatively distant from the first inner tube opening 41. In addition, the second inner tube opening 42 is disposed adjacent to a bottom of the enclosed box 2, and the inner tube 4 includes a gas outlet tube 43 connected to the second inner tube opening 42, but the present disclosure is not limited thereto. For instance, in other embodiments not shown in the present disclosure, the inner tube 4 can also be provided without the gas outlet tube 43.

Figure 6:
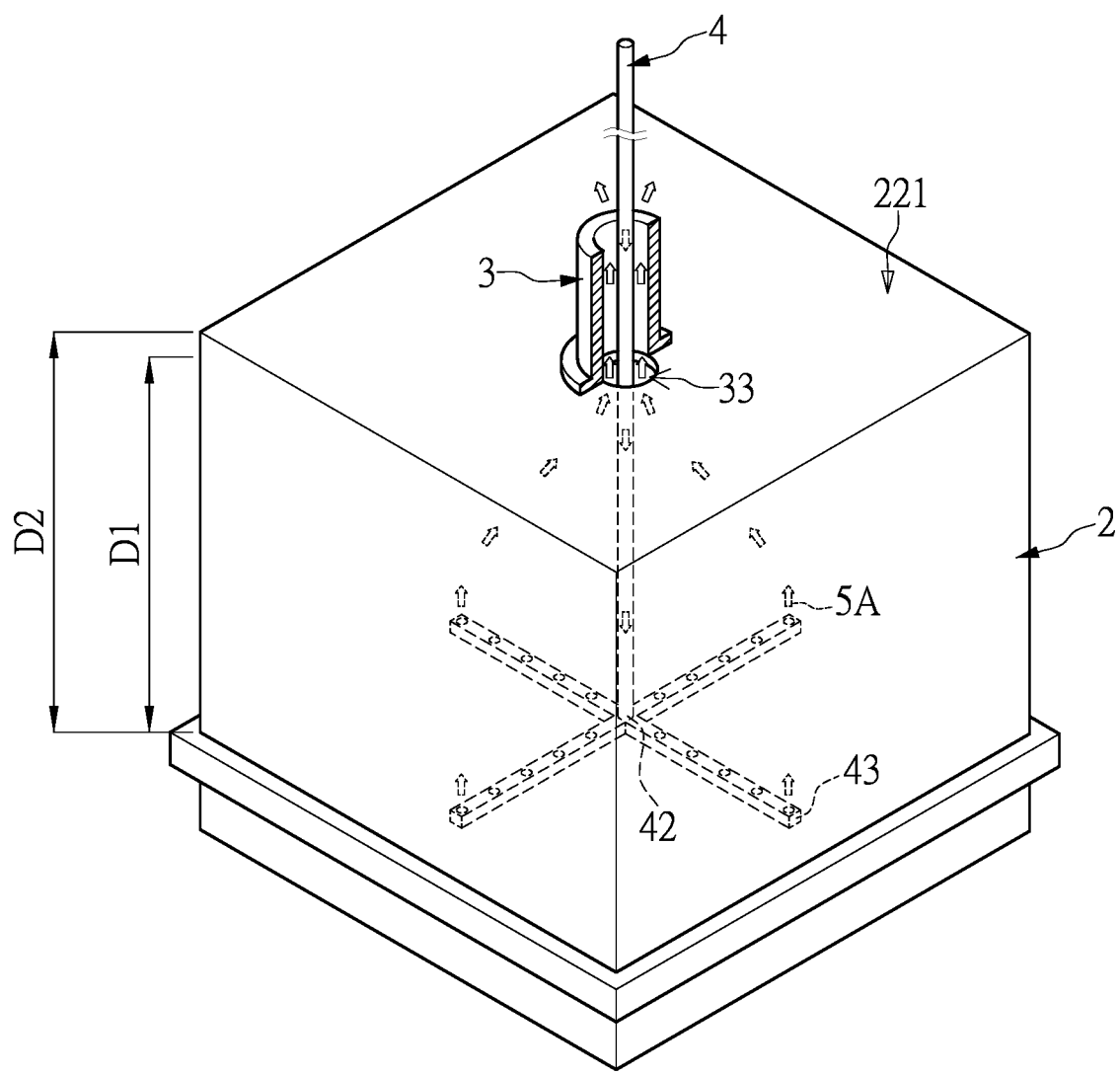
FIG. 6 is a schematic view of a noble gas flowing in an enclosed box according to the first embodiment of the present disclosure.

As shown in FIG. 1, FIG. 4, and FIG. 6, the gas inlet cover 5 is connected to the first outer tube opening 31, and the gas inlet cover 5 can be used to input a noble gas 5A into the enclosed box 2 through the inner tube 4. In addition, materials of the gas inlet cover 5 include stainless steel, and materials of the enclosed box 2 and the inner tube 4 include graphite.

Specifically speaking, the inner tube 4 is disposed spaced apart from an inside of the gas inlet cover 5, and the gas inlet cover 5 is in spatial communication with the inner tube 4 to form an airtight space so that the noble gas 5A will not overflow when passing through the inner tube 4. More specifically, as shown in FIG. 5, the first sealing part 6 is disposed at a connection defined between the gas inlet cover 5 and the first outer tube opening 31, and the second sealing part 7 is surroundingly disposed on the inner tube 4. In addition, the second sealing part 7 is arranged in position to the connection defined between the gas inlet cover 5 and the first outer tube opening 31. In the present embodiment, the first sealing part 6 is a rubber O-ring, and the second sealing part 7 is a rubber tubular ring.

As mentioned above, by virtue of "the first sealing part being disposed at the connection defined between the gas inlet cover and the first outer tube opening" and "the second sealing part being surroundingly disposed on the inner tube," the gas inlet cover 5 can be in spatial communication with the inner tube 4 to form the airtight space so that the noble gas 5A will not overflow when passing through the inner tube 4.

It should be noted that the first inner tube opening 41 is located apart from an outer side of the gas inlet cover 5, and the gas outlet tube 43 can be used to evenly distribute the noble gas 5A in the enclosed box 2. More specifically, the first inner tube opening 41 can be used to be connected to a gas conveyor so that the noble gas 5A can be input from the first inner tube opening 41 and through the inner tube 4 and the gas outlet tube 43 into the enclosed box 2.

More specifically, as shown in FIG. 1 and FIG. 6, the gas outlet tube 43 is in a shape of the letter "X", and the gas outlet tube 43 has a plurality of gas outlet holes that are configured to exhaust the noble gas 5A, but the present disclosure is not limited thereto. For instance, in other embodiments not shown in the present disclosure, the gas outlet tube 43 can also be in an annular shape.

When the noble gas 5A fills the enclosed box 2, the thermal field module 13 heats the noble gas 5A in the enclosed box 2 so that the impurities 300 can be heated and vaporized through the noble gas 5A. More specifically, when the impurities 300 are heated and vaporized through the noble gas 5A, the gas extraction device 8 that is connected to the second outer tube opening 32 of the outer tube 3 can be used to extract the noble gas 5A and the vaporized impurities 300 through the second outer tube opening 32.

Specifically speaking, the gas extraction device 8 can create a negative pressure in the enclosed box 2 so that the noble gas 5A and the gaseous impurities 300 in the enclosed box 2 are extracted through the second inner tube opening 42, and the negative pressure is not greater than 5 Pa.

Accordingly, the purification apparatus 100 can be used to purify and reuse the at least one hot zone part 200 so that the cost incurred by switching or adjusting the product manufacturing process can be reduced.

Second Embodiment

Figure 7:
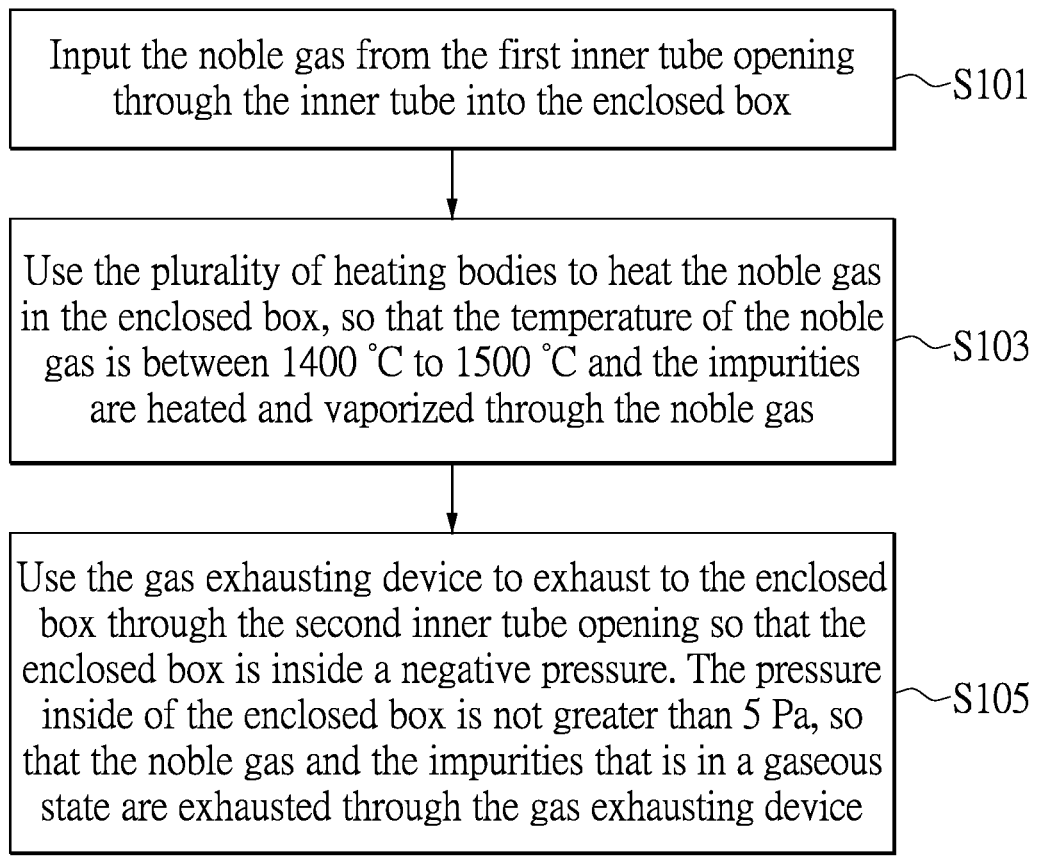
FIG. 7 is a flowchart schematic view of a method of purifying hot zone parts according to a second embodiment of the present disclosure.

Referring to FIG. 7, a second embodiment of the present disclosure is provided. It should be noted that the present embodiment is similar to the above-mentioned first embodiment, and similarities (e.g., the crystal high temperature furnace 1) between the two embodiments will not be described again.

As shown in FIG. 7, the second embodiment of the present disclosure provides a method of purifying the hot zone parts 200, which is configured to be implemented with the purification apparatus 100 of the first embodiment of the present disclosure. The method of purifying the hot zone parts 200 at least includes a gas input step S101, a heating step S103, and a gas extraction step S105 performed in the given order, but the present disclosure is not limited thereto. For instance, in other embodiments not shown in the present disclosure, the method of purifying the hot zone parts 200 can be performed without performing the gas extraction step S105.

It should be noted that, in the gas input step S101, the noble gas 5A is input from the first inner tube opening 41 through the inner tube 4 into the enclosed box 2 that has the at least one hot zone part 200 disposed therein so that the noble gas 5A fills the enclosed box 2.

It should be noted that, in the heating step S103, the heaters 131 heat the noble gas 5A in the enclosed box 2 so that a temperature of the noble gas 5A is between 1400° C. to 1500° C. and the impurities 300 are heated and vaporized through the noble gas 5A.

It should be noted that, in the gas extraction step S105, the gas extraction device 8 creates the negative pressure in the enclosed box 2 so that the noble gas 5A and the gaseous impurities 300 in the enclosed box 2 are extracted through the second inner tube opening 42, and the negative pressure is not greater than 5 Pa.

Accordingly, the method of purifying the hot zone parts 200 can be performed to purify and reuse the at least one hot zone part 200 so that the cost incurred by switching or adjusting the product manufacturing process can be reduced.

Beneficial Effects of the Embodiments

In conclusion, in the purification apparatus 100 and the method of purifying the hot zone parts 200 provided by the present disclosure, by virtue of "the gas inlet cover 5 being configured to input the noble gas 5A into the enclosed box 2 through the inner tube 4" and "the thermal field module 13 being configured to heat the noble gas 5A in the enclosed box 2 so that the impurities 300 are heated and vaporized through the noble gas 5A," the at least one hot zone part 200 can be purified and reused again so that the cost incurred by switching or adjusting product processes can be reduced.

Furthermore, in the purification apparatus 100 provided by the present disclosure, by virtue of "the box cover height D2 being greater than the box height D1, and the box cover height D2 and the box height D1 being at least greater than the height of any one of the hot zone parts 200" and "when the box cover 22 is mounted on the box body 21, the side surfaces 222 of the box cover 22 being movably attached on the side surfaces of the box body 21," the noble gas 5A heated in the enclosed box 2 will not easily overflow from a gap between the box body 21 and the box cover 22.

Furthermore, in the purification apparatus 100 provided by the present disclosure, by virtue of "the gas outlet tube 43 being in the shape of the letter "X", and the gas outlet tube 43 having the gas outlet holes that are configured to exhaust the noble gas 5A," the diffusion velocity and the uniformity of the noble gas 5A in the enclosed box 2 can be increased.

Furthermore, in the purification apparatus 100 provided by the present disclosure, by virtue of "the first sealing part 6 being disposed at the connection defined between the gas inlet cover 5 and the first outer tube opening 31, and the second sealing part 7 being surroundingly disposed on the inner tube 4," the noble gas 5A will not overflow when passing through the inner tube 4.

Furthermore, in the purification apparatus 100 provided by the present disclosure, by virtue of "the gas extraction device 8 being configured to create the negative pressure in the enclosed box 2 so that the noble gas 5A and the gaseous impurities 300 in the enclosed box 2 are extracted through the second inner tube opening 42, and the negative pressure is not greater than 5 Pa," the noble gas 5A and the impurities 300 in the gaseous state can be continuously extracted by the gas extraction device 8.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A purification apparatus, which is configured to remove impurities attached on at least one hot zone part, the purification apparatus comprising:
    a crystal high temperature furnace including a furnace body, a furnace cover mounted on the furnace body, and a thermal field module disposed in the furnace body;
    an enclosed box disposed in the thermal field module and including a box body and a box cover detachably mounted on the box body, wherein the box body is configured to accommodate the at least one hot zone part;
    an outer tube passing through the furnace cover and including a first outer tube opening, a second outer tube opening, and a third outer tube opening, wherein the first outer tube opening and the second outer tube opening are spaced apart from a side of the furnace cover, the side of the furnace cover is distant from the furnace body, and the third outer tube opening is connected to the box cover;
    an inner tube disposed within the outer tube and spaced apart from an inner side of the outer tube, wherein the inner tube includes a first inner tube opening and a second inner tube opening; and
    a gas inlet cover connected to the first outer tube opening and configured to input a noble gas into the enclosed box through the inner tube, wherein the thermal field module is configured to heat the noble gas in the enclosed box so that the impurities are heated and vaporized through the noble gas.

2. The purification apparatus according to claim 1, further comprising a first sealing part and a second sealing part, wherein the first sealing part is disposed at a connection defined between the gas inlet cover and the first outer tube opening, and the second sealing part is surroundingly disposed on the inner tube.

3. The purification apparatus according to claim 2, wherein the second sealing part corresponds in position to the connection defined between the gas inlet cover and the first outer tube opening.

4. The purification apparatus according to claim 1, further comprising a gas extraction device connected to the second outer tube opening, wherein the gas extraction device is configured to extract the noble gas and the vaporized impurities through the second outer tube opening.

5. The purification apparatus according to claim 1, wherein the second inner tube opening is disposed adjacent to a bottom of the enclosed box, and the inner tube further includes a gas outlet tube, wherein the gas outlet tube is connected to the second inner tube opening, and the gas outlet tube is configured to evenly distribute the noble gas in the enclosed box.

6. The purification apparatus according to claim 5, wherein the gas outlet tube is in a shape of the letter "X", and the gas outlet tube has a plurality of gas outlet holes that are configured to exhaust the noble gas.

7. The purification apparatus according to claim 1, wherein the gas inlet cover is in spatial communication with the inner tube to form an airtight space.

8. The purification apparatus according to claim 1, wherein the box cover has a top surface and a plurality of side surfaces connected to the top surface, and a height of each of the side surfaces is greater than a height of the box body.

9. A method of purifying hot zone parts, which is configured to be implemented with the purification apparatus as claimed in claim 1, the method of purifying the hot zone parts comprising:

performing a gas input step including inputting the noble gas from the first inner tube opening through the inner tube that is disposed within the outer tube and spaced apart from the inner side of the outer tube into the enclosed box that has the at least one hot zone part disposed therein so that the noble gas fills the enclosed box;

performing a heating step including using a plurality of heaters to heat the noble gas in the enclosed box so that a temperature of the noble gas is between 1400° C. to 1500° C. and the impurities are heated and vaporized through the noble gas; and performing a gas extraction step including using a gas extraction device connected to the second outer tube opening of the outer tube to create a negative pressure in the enclosed box so that the noble gas and the gaseous impurities in the enclosed box are extracted.

10. The method of purifying the hot zone parts according to claim 9, wherein the negative pressure is not greater than 5 Pa.

11. The method of purifying the hot zone parts according to claim 9, wherein the second inner tube opening is disposed adjacent to the bottom of the enclosed box, and the inner tube further includes the gas outlet tube, wherein the gas outlet tube is connected to the second inner tube opening, and the gas outlet tube is configured to evenly distribute the noble gas in the enclosed box.

* * * * *